US007943480B2

(12) United States Patent
Edelstein et al.

(10) Patent No.: US 7,943,480 B2
(45) Date of Patent: May 17, 2011

(54) SUB-LITHOGRAPHIC DIMENSIONED AIR GAP FORMATION AND RELATED STRUCTURE

(75) Inventors: Daniel C. Edelstein, White Plains, NY (US); Nicholas C. M. Fuller, North Hills, NY (US); David V. Horak, Essex Junction, VT (US); Elbert E. Huang, Carmel, NY (US); Wai-Kin Li, Beacon, NY (US); Anthony D. Lisi, Poughkeepsie, NY (US); Satyanarayana V. Nitta, Poughquag, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 12/029,800

(22) Filed: Feb. 12, 2008

(65) Prior Publication Data

US 2009/0200636 A1 Aug. 13, 2009

(51) Int. Cl.
*H01L 23/00* (2006.01)
(52) U.S. Cl. ........ 438/421; 438/400; 438/411; 257/506; 257/522
(58) Field of Classification Search .................. 257/506, 257/510, 522, 758, E23.013; 438/619, 622, 438/637, 400, 411, 421
See application file for complete search history.

(56) References Cited

U.S. PATENT DOCUMENTS 6,475,904 B2 * 11/2002 Okoroanyanwu et al. .... 438/637
2004/0127016 A1 * 7/2004 Hoog et al. .................... 438/637

OTHER PUBLICATIONS

"Method to Generate Airgaps With A Template First Scheme and a Self Aligned Blockout Mask", Colburn et al., U.S. Appl. No. 11/518,773, filed Sep. 11, 2006.
Nitta, Satya, "A Multilevel Copper/Low-k//Airgap BEOL Technology", Advanced Metalization Conference 2007, IBM Corporation, 20 pages.

* cited by examiner

*Primary Examiner* — David Vu
*Assistant Examiner* — Suberr Chi
(74) *Attorney, Agent, or Firm* — Katherine S. Brown; Hoffman Warnick LLC

(57) ABSTRACT

Sub-lithographic dimensioned air gap formation and related structure are disclosed. In one embodiment, a method includes forming a dielectric layer including interconnects on a substrate; depositing a cap layer on the dielectric layer; depositing a photoresist over the cap layer; patterning the photoresist to include a first trench pattern at most partially overlying the interconnects; forming a spacer within the first trench pattern to form a second trench pattern having a sub-lithographic dimension; transferring the second trench pattern into the cap layer and into the dielectric layer between the interconnects; and depositing another dielectric layer to form an air gap by pinching off the trench in the dielectric layer.

13 Claims, 6 Drawing Sheets

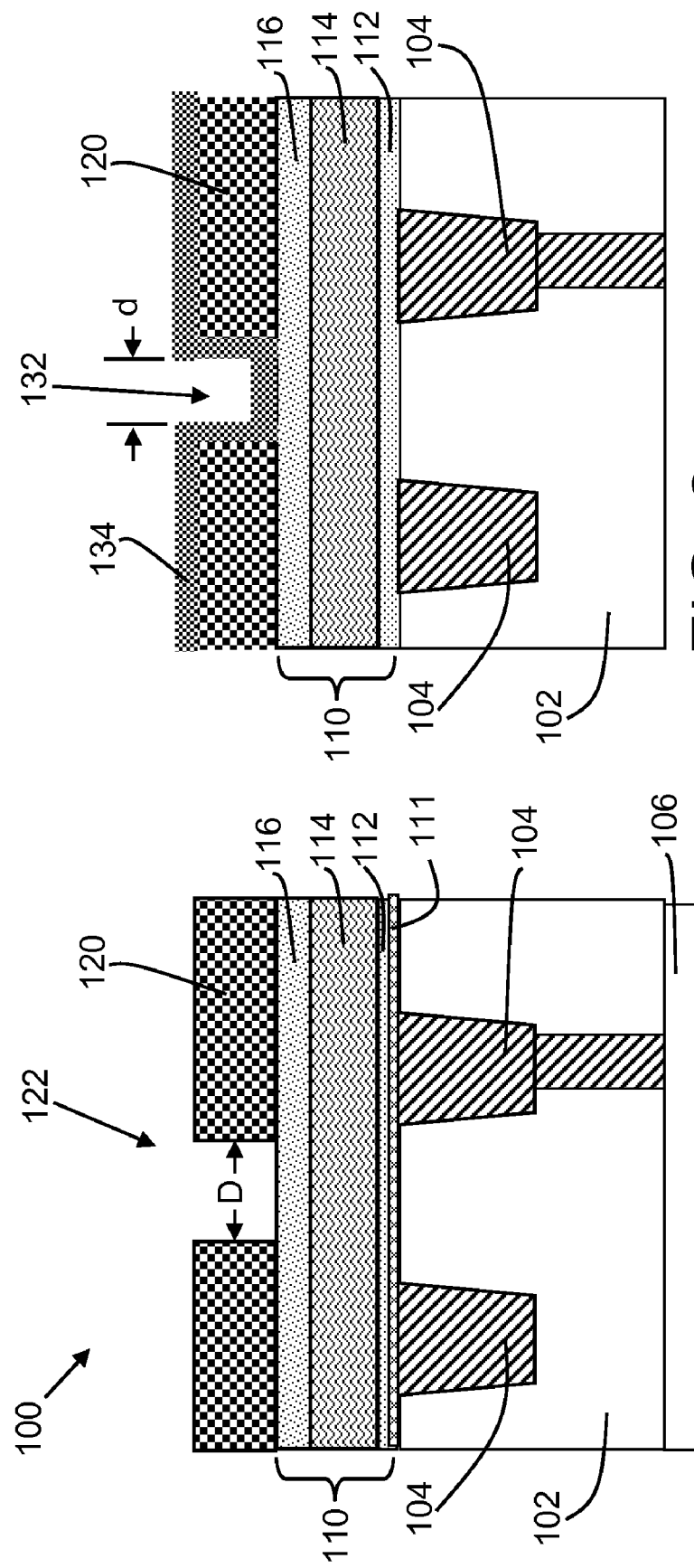

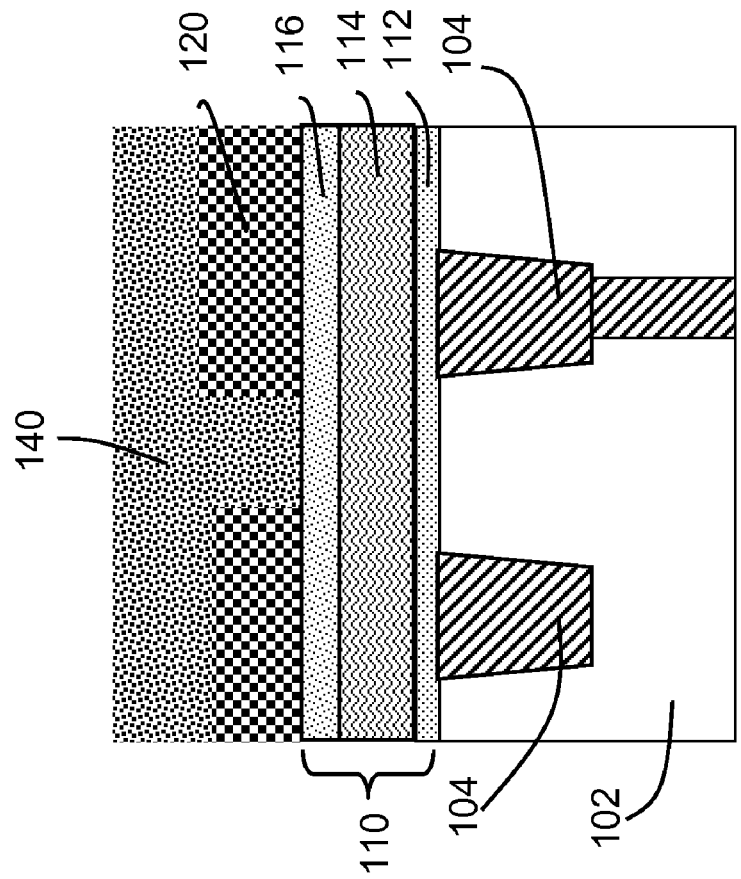
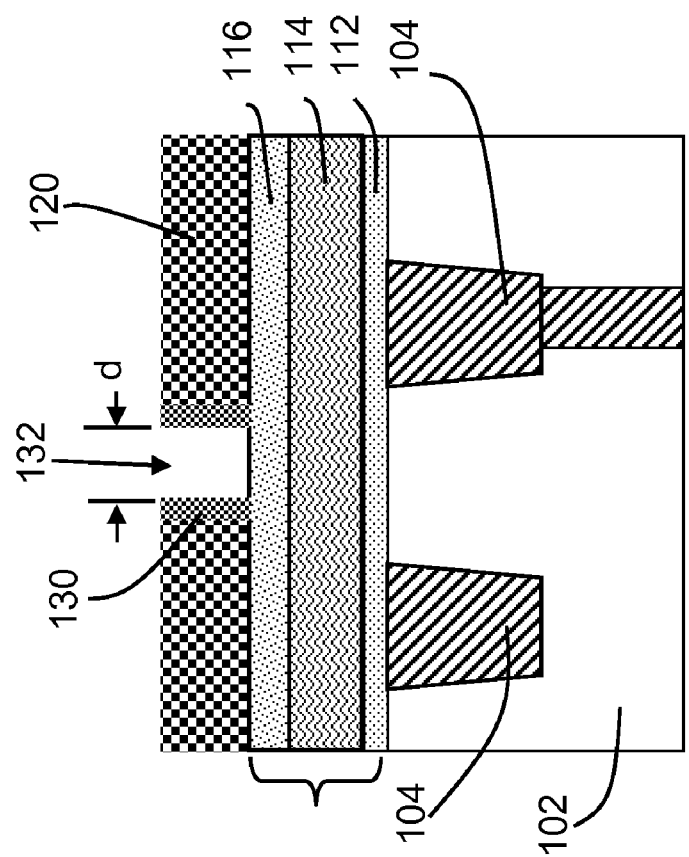
FIG. 3
FIG. 4A

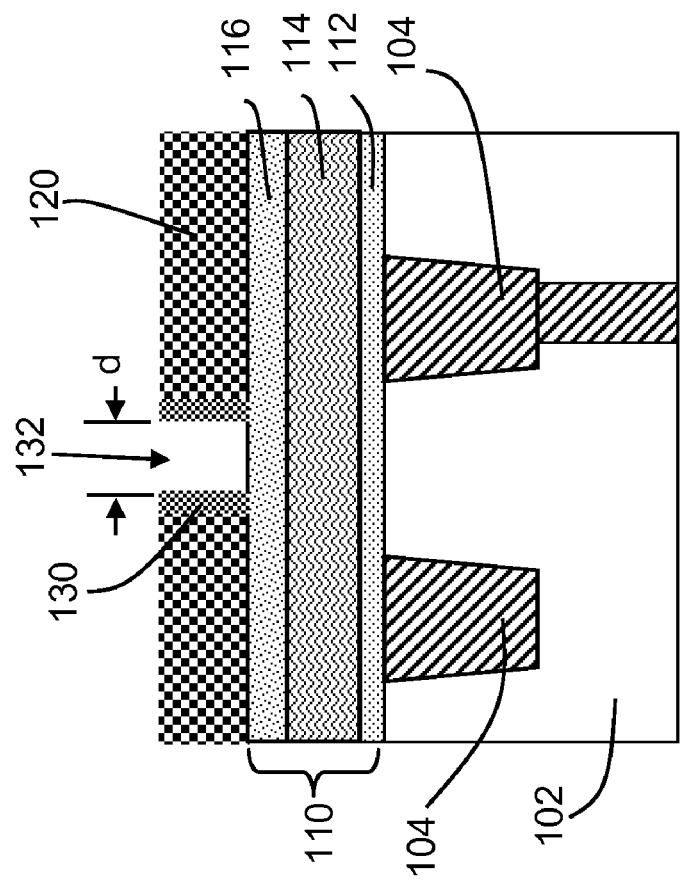
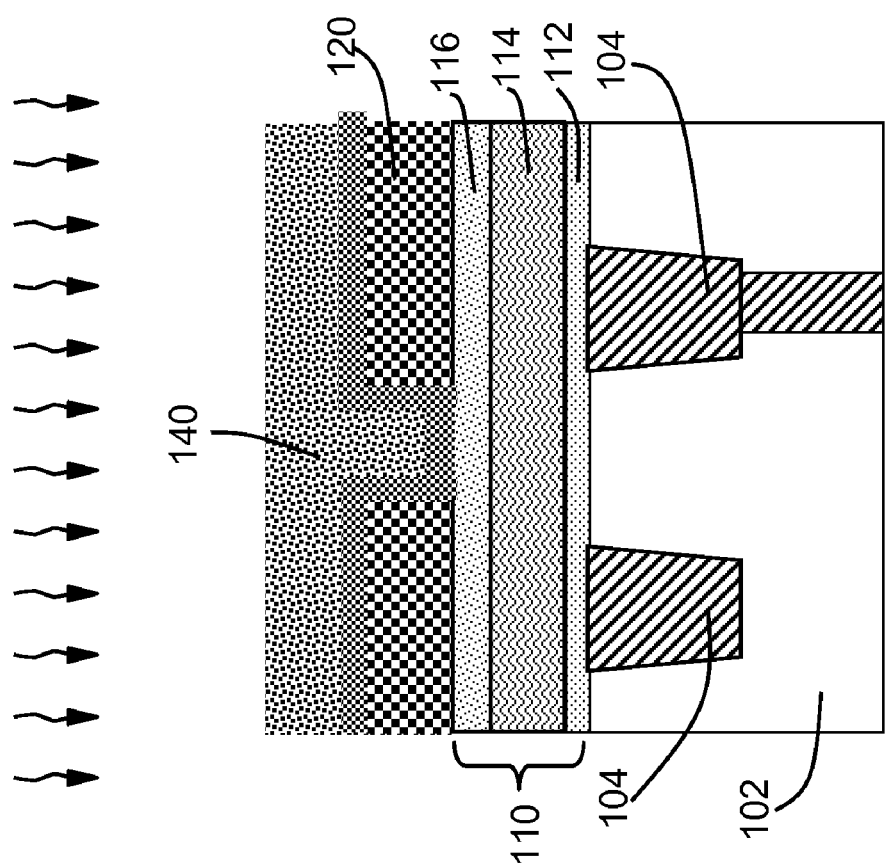
FIG. 4C
FIG. 4B

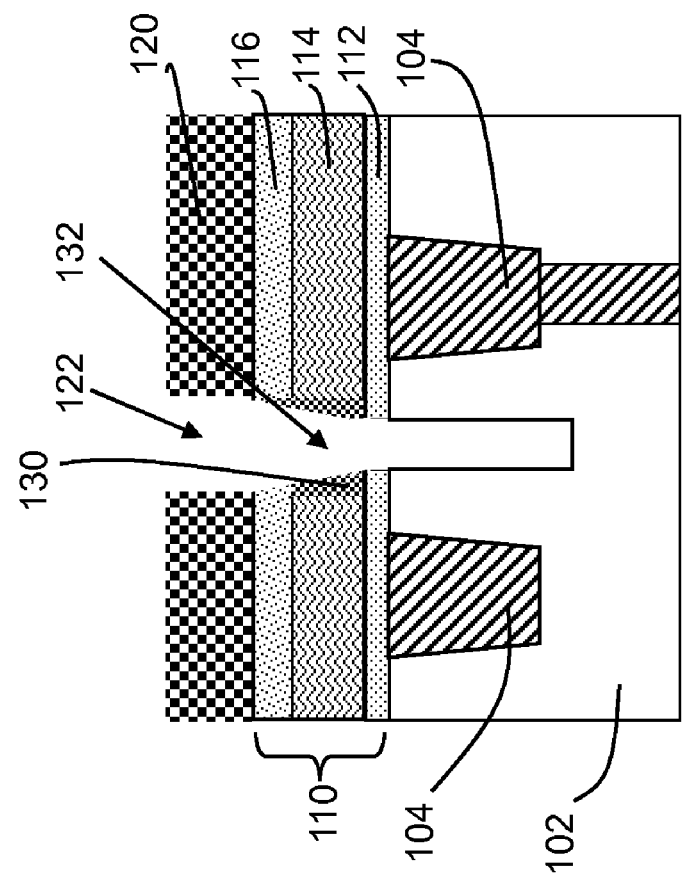
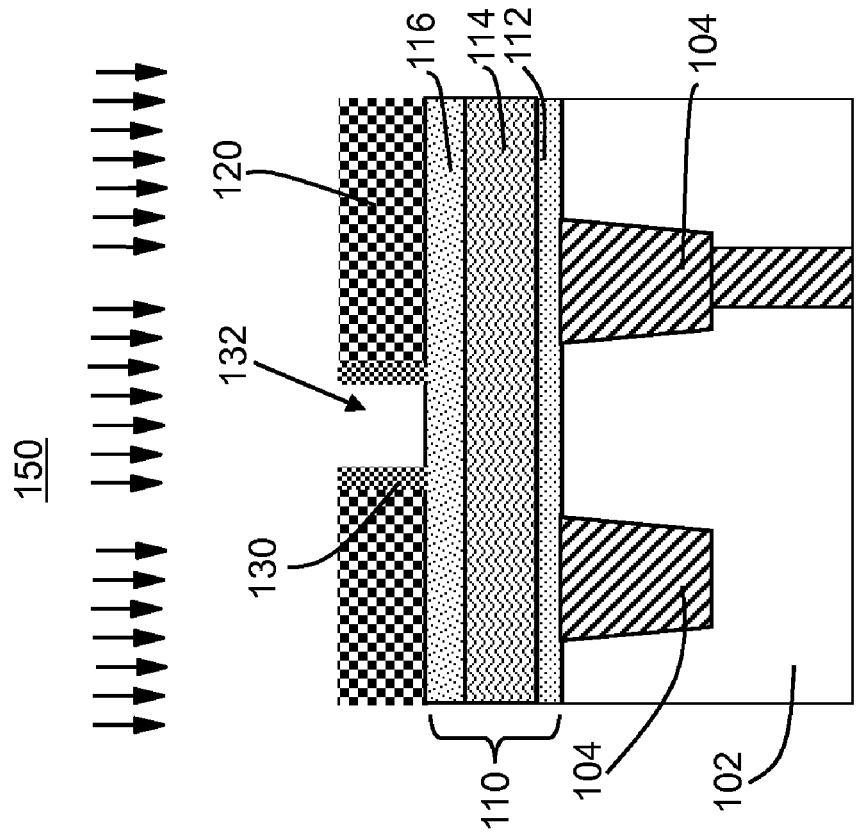

# US 7,943,480 B2

SUB-LITHOGRAPHIC DIMENSIONED AIR GAP FORMATION AND RELATED STRUCTURE

BACKGROUND

1. Technical Field

The present disclosure relates to integrated circuit (IC) chip fabrication, and more particularly, to air gap formation for metal-insulator interconnect structures for very large scale integrated (VLSI) and/or ultra-large scale integrated (ULSI) devices.

2. Background Art

Integrated circuit (IC) chips use air gaps within a dielectric material to increase the insulative characteristics of the dielectric material. One challenge facing the IC chip fabrication industry is protecting copper (Cu) interconnects within the dielectric material from exposure to processing steps during air gap fabrication at thin wires (e.g., <50 nm), which requires sub-ground rule lithography for any given technology generation. Current approaches use diblock copolymers as templates to form air gaps at thin wire levels. However, since copper (Cu) interconnects are not protected during this process, several reliability issues arise with this approach. Currently, there is no known solution to creating copper (Cu) exposure free thin wire air gaps using the diblock technology. One proposed approach opens holes in the dielectric material between copper (Cu) interconnects through a cap layer and extracts the dielectric material through the cap layer to minimize or avoid exposing copper (Cu) interconnects. Another dielectric material formed over the cap layer pinches off the opening to form the air gap. This approach uses wet etch techniques to extract the dielectric material remaining between the holes. This approach, however, is limited by the ability to damage and extract the dielectric material in the spaces between the holes. That is, the lithography required to pattern the holes has to be able to reach a level smaller than the spacing between the copper (Cu) interconnects, i.e., a level below currently available lithographic standards. For example, for 60 nanometer (nm) technology, spacing between interconnects is currently about 100 nm, so current 100 nm lithography technology typically results in exposing at least one of the interconnects.

SUMMARY

Sub-lithographic dimensioned air gap formation and related structure are disclosed. In one embodiment, a method includes forming a dielectric layer including interconnects on a substrate; depositing a cap layer on the dielectric layer; depositing a photoresist over the cap layer; patterning the photoresist to include a first trench pattern at most partially overlying the interconnects; forming a spacer within the first trench pattern to form a second trench pattern having a sub-lithographic dimension; transferring the second trench pattern into the cap layer and into the dielectric layer between the interconnects; and depositing another dielectric layer to form an air gap by pinching off the trench in the dielectric layer.

A first aspect of the disclosure provides a method comprising: forming a dielectric layer including interconnects on a substrate; depositing a cap layer on the dielectric layer; depositing a photoresist over the cap layer; patterning the photoresist to include a first trench pattern at most partially overlying the interconnects; forming a spacer within the first trench pattern to form a second trench pattern having a sub-lithographic dimension; transferring the second trench pattern into the cap layer and into the dielectric layer between the interconnects; and depositing another dielectric layer to form an air gap by pinching off the trench in the dielectric layer.

A second aspect of the disclosure provides a structure comprising: a pair of interconnects in a first dielectric layer over a substrate; a cap layer positioned over the first dielectric layer and the pair of interconnects; a second dielectric layer over the cap layer; and an air gap trench between the pair of interconnects, the air gap trench including an opening in the cap layer having a sub-lithographic dimension.

A third aspect of the disclosure provides a method of forming an air gap containing interconnect structure, the method comprising: forming a dielectric layer including interconnects on a substrate; depositing a plurality of cap layers on the dielectric layer; depositing a photoresist over the cap layers; patterning the photoresist to include a first trench pattern at most partially overlying the interconnects; forming a spacer within the first trench pattern to form a second trench pattern having a sub-lithographic dimension; transferring the second trench pattern into the cap layers and into the dielectric layer between the interconnects; removing all of the cap layers except one prior to the depositing of the another dielectric layer; and depositing another dielectric layer to form an air gap by pinching off the trench in the dielectric layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1-9 show embodiments of a method according to the disclosure, with FIG. 9 showing a structure according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 8:
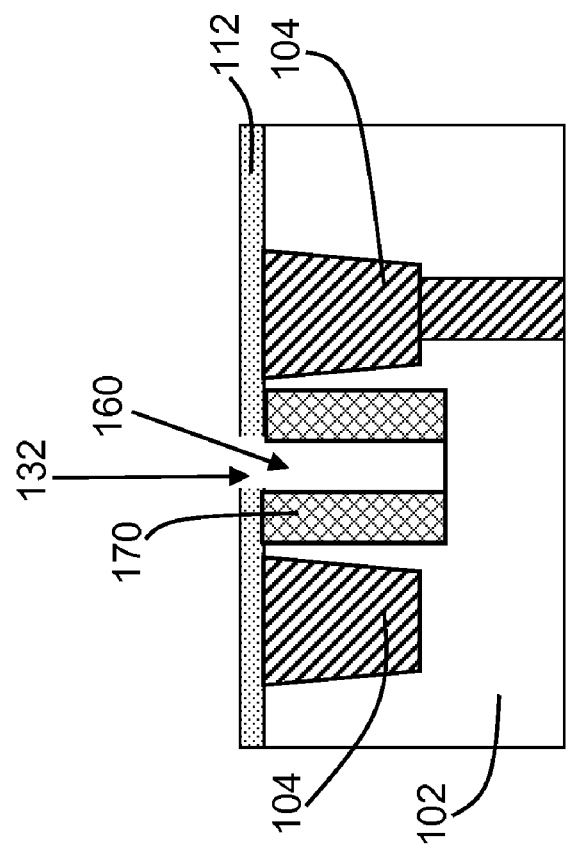

Referring to the drawings, FIGS. 1-7 show embodiments of a method according to the disclosure. FIG. 1 shows a preliminary structure 100 including forming a dielectric layer 102 including interconnects 104 on a substrate 106 (latter not shown in many drawings for clarity). Dielectric layer 102 may include any now known or later developed interlevel dielectric such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon contained polymer material available from, e.g., JSR Corporation, other low dielectric constant (<3.9) material, or combinations thereof. Interconnects 104 may include any now known or later developed interconnect material such as copper (Cu) or aluminum (Al). Liners for interconnects 104 have been omitted from the drawings for clarity.

FIG. 1 also shows depositing a cap layer 110 on dielectric layer 102. In one embodiment, cap layer 110 may include a number of layers (e.g., at least three layers), as shown, such as, but not limited to: a silicon carbide layer (e.g., NBlok) 111 (shown in FIG. 1 only for clarity), a silicon nitride ($Si_3N_4$) layer 112, a near frictionless carbon (NFC) layer 114 and a low temperature oxide ($SiO_2$) layer 116. An alternate stack could include: a silicon carbide layer (e.g., NBlok) 111, a silicon nitride ($Si_3N_4$) layer 112, an organic layer (ODL) 114, and a Si containing anti-reflective coating (ARC) layer 116. Unless described otherwise herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating or evaporation.

FIG. 1 also shows depositing a photoresist 120 over cap layer 110, and patterning photoresist 120 to include a first trench pattern 122 at most partially overlying interconnects 104, i.e., not overlying or only partially overlying interconnects 104. That is, trench pattern 122 extends into and out of the page of the drawing to an extent greater than a simple hole. Photoresist 120 may be patterned using any now known or later developed photolithographic technique. Hence, trench pattern 120 has a dimension D (i.e., width) that is limited to conventional lithographic standards in minimum size.

FIGS. 2-6 show embodiments of forming a spacer 130 (FIG. 3) within a first trench pattern 122 (FIG. 1) to form a second trench pattern 132 having a sub-lithographic dimension d. That is, spacer 130 narrows the dimension D of first trench pattern 122 to a sub-lithographic dimension d such that dimension d has a size that is unresolvable by conventional high numerical aperture (NA) immersion steppers used in semiconductor manufacturing. In one embodiment, sub-lithographic dimension d may be less than approximately 50 nanometers. Sub-lithographic dimension d is smaller than a minimum distance between interconnects 104. Second trench pattern 132 may also have a smaller size in a lower cap layer, e.g., layer 114, than in a higher cap layer, e.g., layer 116, created during formation of second trench pattern 132.

Spacer 130 may be formed in a number of ways. In one embodiment, as shown in FIG. 2, a conformal layer 134 is deposited prior to the transferring, and as shown in FIG. 3, removing conformal layer 134 on a surface of photoresist 122 to form second trench pattern 132. The removal may include planarizing, e.g., via chemical mechanical polishing (CMP)). Conformal layer 134 is deposited, for example, using CVD of a conformal material such as silicon nitride ($Si_3N_4$) such that second trench pattern 132 remains, i.e., the trench is not filled. In another embodiment, also represented by FIG. 3, spacer 130 forming may include simply depositing a conformal layer that forms spacer 130. For example, spacer 130 may be formed by depositing tetrafluoromethane ($CF_4$) and/or octafluorocyclobutane ($C_4F_8$) based material, which results in a thin layer that shrinks trench pattern 122 (FIG. 1) size.

In another embodiment, spacer 130 forming may include, as shown in FIG. 4A-C, performing a chemical shrink process. FIG. 4A shows forming a polymer 140 (FIG. 4A) in first trench pattern 122 (FIG. 1), e.g., by deposition. In this case, photoresist 120 may include argon (Ar) and fluorine (F). FIG. 4B shows cross-linking polymer 140 with photoresist 120. The cross-linking may be achieved by annealing, for example, at approximately 155° C. FIG. 4C shows patterning and etching cross-linked polymer 140 to form second trench pattern 132 (and spacer 130).

FIG. 5 shows another embodiment in which spacer 130 forming may include performing a "polymer re-deposition" prior to transfer of the first trench pattern, i.e., in a reactive ion etch (RIE) chamber prior to an initiation of pattern transfer. The "polymer re-deposition" is usually accomplished in a reactive ion etch (RIE) chamber using a mixture of fluorocarbon gases. The polymer re-deposition forms a spacer 130 that forms second trench pattern 132.

In another embodiment, spacer 130 forming may include the use of a self-assembled layer. The self assembled layer may be a layer that provides conformal coating atop the structure having a topography corresponding to the airgap mask that optionally may be defined by an anisotropic RIE process to provide a spacer structure. The self assembled layer may be applied by spin-coating and optionally may involve a subsequent rinsing step to remove excess self assembled layer materials. This rinsing may involve the use of solvents that can remove the self assembled material but will not affect underlying layers (e.g., photoresist layer). The self-assembled layer may be comprised of a variety systems including: polymer brushes (i.e., polymeric material with one terminal group bound to the substrate), block copolymer having one block that segregates to the substrate interface, multilayered polyelectrolytes, etc.

Referring to FIG. 6, in yet another embodiment, one of cap layers 110 may include an organic planarizing layer, e.g., layer 114, which may include, for example, a near-frictionless carbon (NFC) layer, and a low temperature oxide (LTO) layer 116. During the transfer of first trench pattern 122, the pattern is tapered down such that the opening becomes a sub-lithographic second trench pattern 132 by the time it clears LTO layer 116. This pattern 132 is then transferred down through organic planarizing layer 114 and any other layers (e.g., layer 112) provided. Hence, second trench pattern 132 has a smaller size in a lower cap layer 114 than in a higher cap layer 116.

An alternate method of shrinking involves transferring first trench pattern 122 straight through LTO layer 116, and into organic planarizing layer 114. At this point, the RIE transfer is interrupted and any conformal coating method already discussed can be used on top of LTO layer 116 to form spacer 130 in LTO layer 116 (i.e., spacer 130 is formed after the conformal deposition followed by a RIE to remove the conformal layer from the top and bottom of the trench leaving it on the sidewall).

Figure 7:
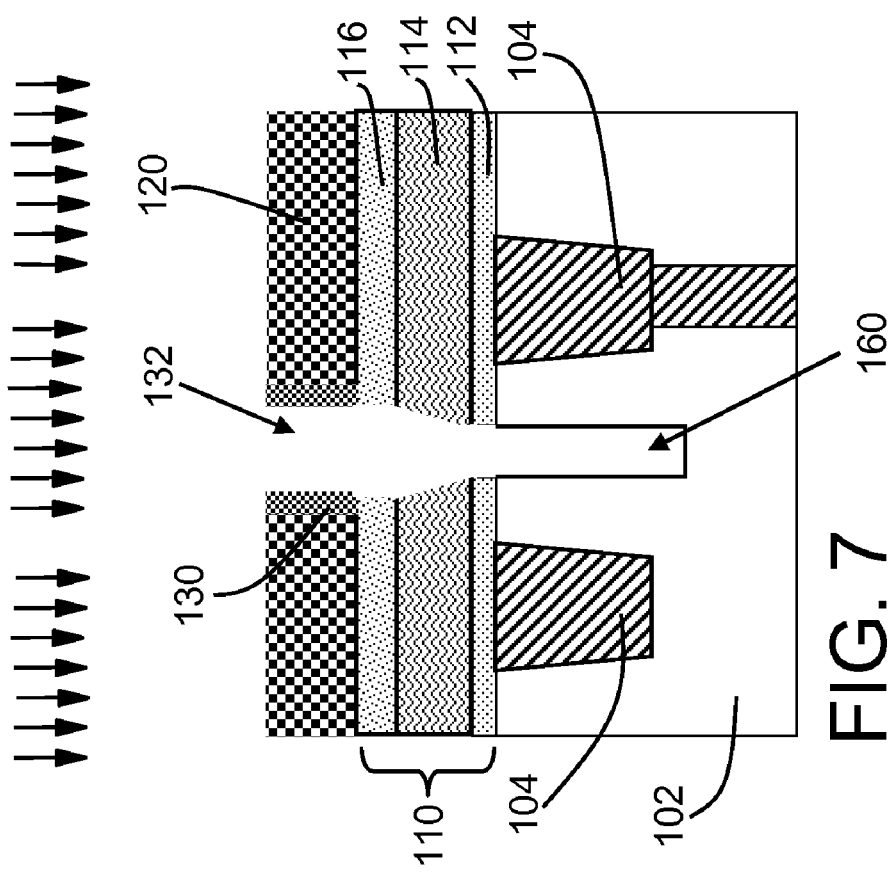

FIG. 7 shows transferring second trench pattern 132 into cap layer 110 and into dielectric layer 102 between interconnects 104, e.g., by a reactive ion etch (RIE) or other etching process (using FIGS. 3, 4C and 5 embodiments for spacer 130). (Note, FIG. 6 also shows at least partial transfer of second trench pattern 132, which may occur during formation of spacer 130 according to that embodiment). Sub-lithographic trench 160 is formed between interconnects 104. Since sub-lithographic dimension d (FIGS. 3 and 4C) is smaller than a minimum distance between interconnects 104, exposure of interconnects 104 is avoided.

Figure 9:
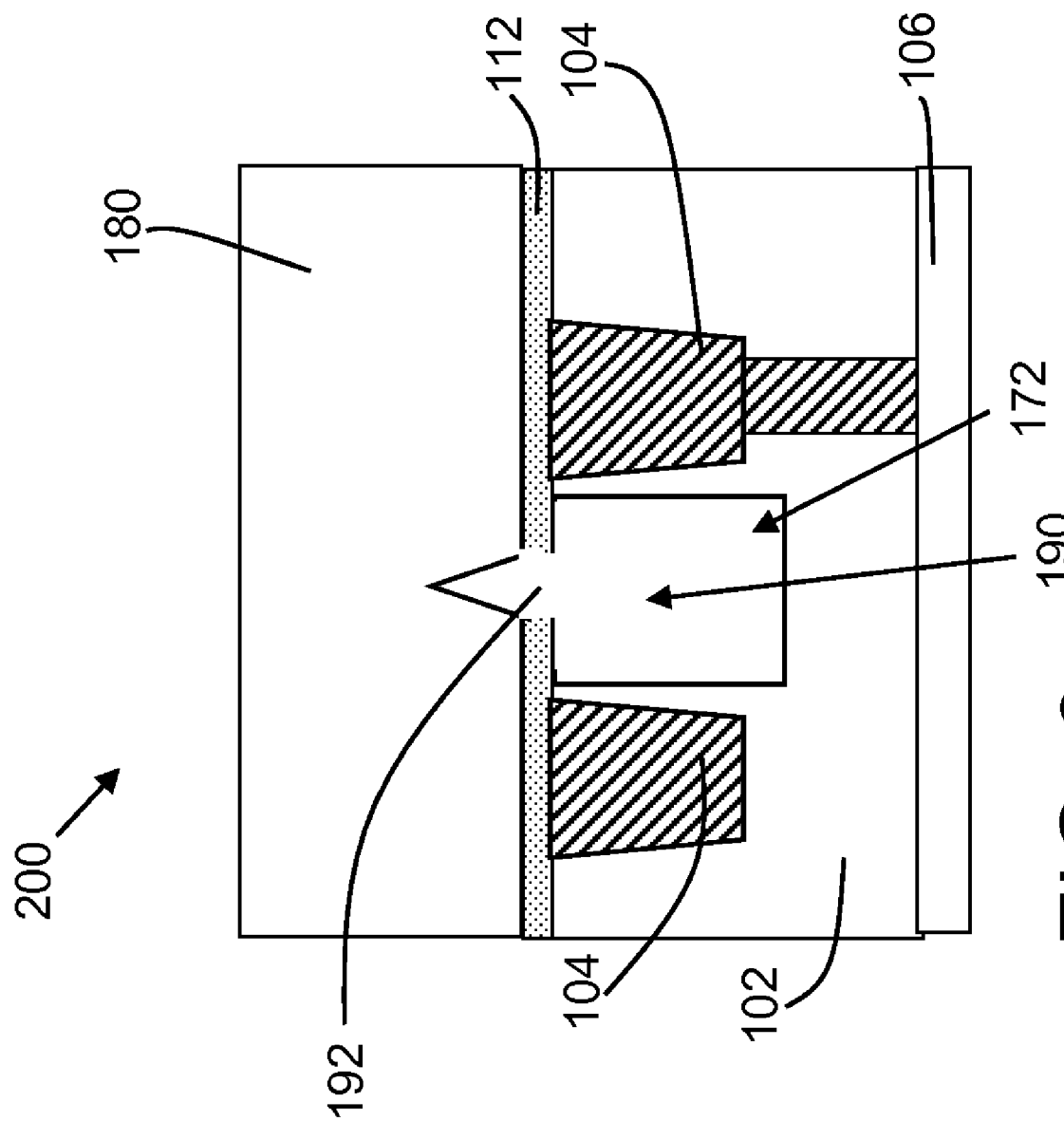

FIG. 8 shows an optional process of removing all of cap layers 110 except one (layer 112 as shown) prior to depositing of another dielectric layer 180 (FIG. 9), as will be described herein. Cap layers 110 may be removed using any conventional etching process (e.g., RIE, hydrofluoric acid (HF) wet etch, etc.) appropriate for the material of cap layers 110 to be removed. FIG. 8 also shows extracting dielectric layer 102 between interconnects 104 through second trench pattern 132 in cap layer 112. This process may occur as described in currently co-pending U.S. patent application Ser. No. 11/518, 773, which is hereby incorporated by reference. For example, dielectric layer 102 along trench 160 is damaged to form a damaged portion 170, and then a known etchant is used to remove the damaged portion resulting in a larger trench 172, as shown in FIG. 9, although second trench pattern 132 remains the same size. A de-methylation of dielectric layer 102 may be necessary if the dielectric is an organosilicate material such as a dense or porous spin-on or CVD SiCOH based material. The etchant may include, for example, wet etchants such as diluted HF or ammonium hydroxide based etchants, or a vapor based or carbon dioxide based etchant. The patent application mentioned above uses post lithographic shrinks to minimize or avoid exposing interconnects during the etchback gap formation. However, the methods described therein do not cover the use of trenches to form air gaps and instead rely on using wet etch techniques to damage out the dielectric pillars remaining between holes. Hence, those methods are limited by the ability to damage and extract out the dielectric pillars in the spaces between holes. In addition, only conformal coatings and chemical resist shrink methods are mentioned in that patent application.

FIG. 9 shows depositing another dielectric layer 180 to form an air gap trench 190 by pinching off trench (160 or 172, latter shown) in dielectric layer 102. Dielectric layer 180 may include any material described above relative to dielectric layer 102. A structure 200 results including pair of interconnects 104 in dielectric layer 102 over substrate 106. A cap layer (only 112 remains in this embodiment) positioned over dielectric layer 102 and interconnects 104. Second dielectric layer 180 is positioned over cap layer 112, and an air gap trench 190 between pair of interconnects 104. Air gap trench 190 includes opening 192 in cap layer 112 having a sub-lithographic dimension d (FIG. 3). As noted above, in one embodiment, sub-lithographic dimension d may be less than approximately 50 nanometers. Where extraction of dielectric layer 102 is completed, as shown in FIG. 9, air gap trench 190 between pair of interconnects 104 has a dimension greater than opening 192.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   forming a dielectric layer including interconnects on a substrate;
   depositing a cap layer on the dielectric layer, wherein the cap layer includes at least three cap layers and one of the at least three cap layers includes a silicon carbide layer;
   depositing a photoresist over the cap layer;
   patterning the photoresist to include a first trench pattern at most partially overlying the interconnects;
   forming a spacer within the first trench pattern to form a second trench pattern having a sub-lithographic dimension;
   transferring the second trench pattern into the cap layer and into the dielectric layer, such that a trench is formed between the interconnects; and
   depositing another dielectric layer to form an air gap by pinching off the trench in the dielectric layer.

2. The method of claim 1, further comprising removing all of the cap layers except one prior to the depositing of the another dielectric layer.

3. The method of claim 1, wherein the second trench pattern includes a smaller size in a lower cap layer than in a higher cap layer.

4. The method of claim 1, wherein one of the at least three cap layers includes an organic planarizing layer.

5. The method of claim 4, wherein the spacer forming includes forming a low temperature oxide (LTO) conformal layer on the organic planarizing layer.

6. The method of claim 1, further comprising extracting the dielectric layer between the interconnects through the second trench pattern in the cap layer.

7. The method of claim 1, wherein the sub-lithographic dimension is smaller than a minimum distance between the interconnects.

8. The method of claim 1, wherein the interconnects include copper interconnects.

9. The method of claim 1, wherein the spacer forming includes depositing a conformal layer and removing the conformal layer on a surface of the photoresist to form the second trench pattern.

10. The method of claim 1, wherein the spacer forming includes depositing a conformal layer.

11. A method of forming an air gap containing interconnect structure, the method comprising:
    forming a dielectric layer including interconnects on a substrate;

depositing a plurality of cap layers on the dielectric layer;

depositing a photoresist over the cap layers;

patterning the photoresist to include a first trench pattern at most partially overlying the interconnects;

forming a spacer within the first trench pattern to form a second trench pattern having a sub-lithographic dimension;

transferring the second trench pattern into the cap layers and into the dielectric layer, such that a trench is formed between the interconnects;

removing all of the cap layers except one prior to the depositing of the another dielectric layer; and depositing another dielectric layer to form an air gap by pinching off the trench in the dielectric layer.

12. The method of claim 11, further comprising extracting the dielectric layer between the interconnects through the second trench pattern in the cap layer.

13. The method of claim 11, wherein the sub-lithographic dimension is smaller than a minimum distance between the interconnects.

* * * * *